United States Patent [19]

Katayama

[11] Patent Number: 4,788,513

[45] Date of Patent: Nov. 29, 1988

[54] REMANENT SUBCARRIER COMPONENT SUPPRESSING DEVICE FOR BALANCED MODULATOR

[75] Inventor: Tomoyuki Katayama, Kobe, Japan

[73] Assignee: DX Antenna Company, Ltd., Kobe, Japan

[21] Appl. No.: 111,261

[22] Filed: Oct. 22, 1987

[30] Foreign Application Priority Data

Oct. 27, 1986 [JP] Japan .............................. 61-256176

[51] Int. Cl.[4] .............................................. H03C 3/00

[52] U.S. Cl. ...................................... 332/16 R; 455/63

[58] Field of Search .................... 332/16 R, 18, 21, 22, 332/23 R; 455/42–45, 63, 102, 110, 114; 375/58, 60

[56] References Cited

U.S. PATENT DOCUMENTS 4,323,731 4/1982 Hershberger ..................... 332/21 X

OTHER PUBLICATIONS

"Broadcasters" published by Nippon Hoso Shuppan Kyokai on Apr. 20, 1983, pp. 66–70.

*Primary Examiner*—Eugene R. LaRoche
*Assistant Examiner*—David Mis
*Attorney, Agent, or Firm*—Morris Fidelman; Franklin D. Wolffe

[57] ABSTRACT

A device to be incorporated with a balanced modulator included in a sub-channel of a stereophonic modulator circuit for suppressing a subcarrier component remaining in the output signal of the balanced modulator. This device only includes a full-wave rectifier for rectifying the subcarrier and a mixer for subtractively mixing the output of the modulator with the rectified subcarrier wave, thereby effectively cancelling the remanent subcarrier component in very simple and economical fashion.

1 Claim, 1 Drawing Sheet

REMANENT SUBCARRIER COMPONENT SUPPRESSING DEVICE FOR BALANCED MODULATOR

BACKGROUND OF INVENTION

This invention relates to a device for suppressing a subcarrier component remaining in the output signal of a balanced modulator included, for example, in a stereophonic modulation circuit for forming a sub-channel of a FM stereophonic composite signal.

As shown, for example, in pages 66 to 70 of "BROADCASTERS" edited by Nippon Hoso Kyokai (Japanese Broadcast Association) and published by Nippon Hoso·Shuppan Kyokai (Japanese Broadcast Publishing Association) on Apr. 20, 1983, in a stereophonic modulation circuit, left and right signals L and R are matrixed to form sum and difference signals L+R and L−R which are separately processed and then mixed by a mixer amplifier to form a stereophonic composite signal. The L−R signal processing channel includes a balanced modulator for modulating a 38 KHz subcarrier wave from a subcarrier generator with the L−R signal to form a frequency-modulated (FM) difference signal. This output signal of the balanced modulator generally includes a substantial amount of remanent subcarrier component which is to be removed or suppressed by a band-pass filter as shown in the above-cited reference. For complete removal of such subcarrier component, however, it has been necessary to use a complicated expensive filter circuit.

SUMMARY OF INVENTION

Therefore, an object of this invention is to provide a simple and economical circuit configuration which can effectively suppress this subcarrier component remaining in the output of the balanced modulator.

This object can be attained in accordance with this invention which provides a device for suppressing a remanent subcarrier component in the output of a balanced modulator accompanied by a subcarrier generator for providing a subcarrier wave to be modulated, which comprises a full-wave rectifier circuit including an inversion amplifier and diodes for rectifying in full-wave fashion the subcarrier wave from the subcarrier generator, and a mixer circuit for subtractively combining the output signal of the balanced modulator with the output signal of the full-wave rectifier. The full-wave rectifier circuit further includes means for modifying the balance between rectification sensitivities for positive and negative inputs, and means for adjusting the level of rectified output.

These and other objects and features of this invention will be described in more detail below with reference to the accompanying drawings.

DESCRIPTION OF PREFERRED EMBODIMENT

Figure 1:
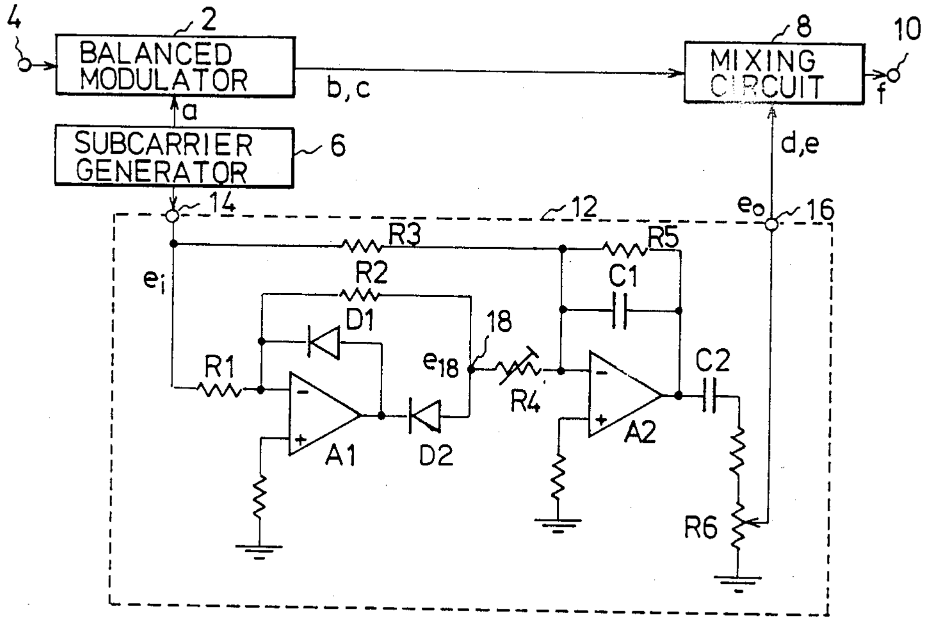
FIG. 1 is a schematic circuit diagram, shown partly in block form, representing an embodiment of remanent subcarrier component suppressing device according to this invention.
Figure 2:
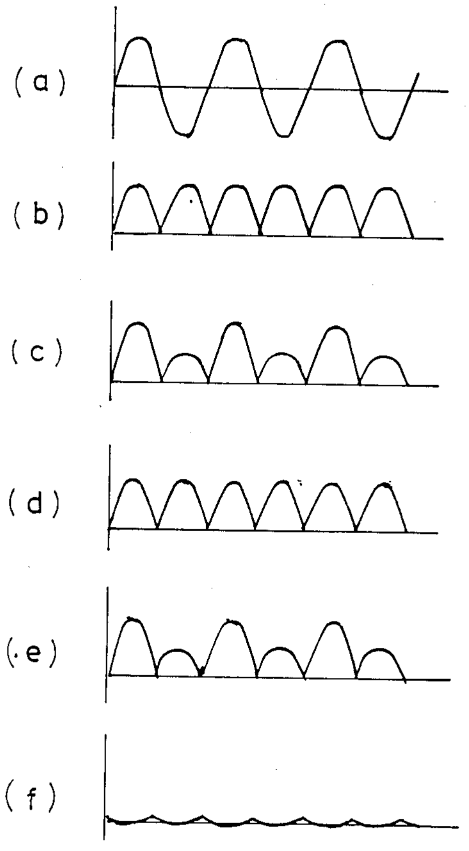
FIG. 2, (*a*) to (*f*) are waveform diagrams used for explaining operation of the device of FIG. 1.

Referring to FIG. 1, a conventional balanced modulator 2 having an input terminal 4 for receiving a difference signal L−R is accompanied by a subcarrier generator 6 which includes, for example, a crystal oscillator and a frequency divider and provides, for example, a 38 KHz subcarrier wave as shown in FIG. 2(*a*) to the balanced modulator 2. The FM output signal of balanced modulator 2 is supplied to a mixing circuit 8 which may be a mixing amplifier for combining the processed sum and difference signals to produce a stereophonic composite signal at its output terminal 10.

It is desirable that no remanent subcarrier component appears in the output signal of balanced modulator 2 when no input signal exists. In practice, however, a remanent subcarrier component having such a waveform as shown in FIG. 2(*b*) or (*c*) appears in the output signal due to incomplete balance, internal strain or the like. It is of course undesirable that such component appears at the output terminal 10. According to this invention, a full-wave rectifier circuit 12 is attached to the modulation circuit in order to cancel such remanent subcarrier component.

The 38 KHz subcarrier wave output of subcarrier generator 6 is also applied to an input terminal 14 of the full-wave rectifier circuit 12. The full-wave rectifier circuit 12 is of a conventional type and includes inversion amplifiers A1 and A2, diodes D1 and D2, fixed resistors R1, R2, R3 and R5, a semi-fixed resistor R4, a potentiometer R6 and capacitors C1 and C2. It rectifies the input subcarrier wave voltage $e_i$ at the input terminal 14 in full-wave fashion and generates a rectified output voltage $e_0$ at its output terminal 16.

Before brief description of the operation of full-wave rectifier 12, it is assumed that the amplifier A1, diodes D1 and D2 and resistors R1 and R2 form in combination an ideal inversion diode and that $R1=R2$ and $e_i>0$. Then, the diode D2 conducts, the amplifier A1 operates as an inversion amplifier and the voltage level $e_{18}$ at a junction 18 becomes $-e_i$. This voltage $-e_i$ is applied through semi-fixed resistor R4 to an inversion amplifier A2 which operates as inversion adder circuit. On the other hand, the input subcarrier wave voltage $e_i$ is applied through resistor R3 to the inversion amplifier A2. Thus, the output $e_0$ which is the sum of both inputs to the amplifier A2 will be given as follows.

$$e_0 = -\left(\frac{R5}{R3}e_i + \frac{R5}{R4}e_{18}\right)$$

If the ratio of R3/R4/R5 is selected as 2/1/2, then $e_0=+e_i$. When $e_i<0$, the output $e_{18}$ of inversion amplifier A1 is zero since diode D1 conducts. Then, the inversion amplifier A2 only receives a negative input $-e_i$ through resistor R3 and, in this case also, $e_0=+e_i$. Here, by adjusting semi-fixed resistor R4, it is possible to change the level of $e_0$ when $e_i>0$ from that when $e_i<0$, thereby controlling the balance in rectification sensitivity. By suitably controlling the rectification sensitivity for both positive and negative inputs in this fashion, a rectified output having a waveform as shown in FIG. 2(*d*) or (*e*) is obtained at the output of inversion amplifier A2. As the overall level of this output signal can be controlled by controlling the potentiometer R6, a waveform which is approximate to the waveform of FIG. 2(*b*) or (*c*) can be obtained at the output terminal 16. Therefore, the remanent subcarrier component (FIG. 2(*b*) or (*c*)) in the output signal of balanced modulator 2 is substantially cancelled by subtractively combining it with the voltage $e_0$ at the output terminal 16 in the mixing circuit 8 as shown in FIG. 2(*f*).

It should be noted that the above description has been made only for illustration purpose and various modifications and changes can be made within the scope of this invention as defined in the appended claims.

For example, the full-wave rectifier circuit 12 may be of any other type, provided it includes means for modifying the balance in rectification sensitivity for both positive and negative inputs and means for controlling the overall level of rectified output. Moreover, the mixing circuit 8 may be provided separately from the mixing amplifier for combining the sum and difference signals to obtain stereophonic composite signal in a stereophonic modulator circuit.

I claim:

1. In a device for suppressing a remanent subcarrier component, in an output signal of a balanced modulator for modulating a subcarrier wave supplied to said modulator from a subcarrier generator with an input signal to said modulator, the improvement comprising a full-wave rectifier means, coupled to said subcarrier generator, for receiving said subcarrier wave also and for rectifying in full-wave fashion said subcarrier wave received by said modulator, a mixing means receiving the output signal of said balanced modulator and an output of said full-wave rectifier means for subtractively combining both said output signals, and said full-wave rectifier means comprising means for changing a balance between rectification sensitivities for positive and negative input levels to said rectifier means and means for controlling a level of said output signal from said rectifier means.

* * * * *